United States Patent
Lavrovskaya et al.

(10) Patent No.: US 9,595,480 B2
(45) Date of Patent: Mar. 14, 2017

(54) METHOD OF FORMING A BICMOS SEMICONDUCTOR CHIP THAT INCREASES THE BETAS OF THE BIPOLAR TRANSISTORS

(71) Applicant: Texas Instruments Incorporated, Dallas, TX (US)

(72) Inventors: Natalia Lavrovskaya, Sunnyvale, CA (US); Alexei Sadovnikov, Sunnyvale, CA (US); Andrew D. Strachan, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/561,008

(22) Filed: Dec. 4, 2014

(65) Prior Publication Data

US 2016/0163598 A1   Jun. 9, 2016

(51) Int. Cl.
| | |
|---|---|
| *H01L 21/337* | (2006.01) |
| *H01L 21/8249* | (2006.01) |
| *H01L 29/66* | (2006.01) |
| *H01L 29/10* | (2006.01) |
| *H01L 29/08* | (2006.01) |
| *H01L 27/06* | (2006.01) |
| *H01L 21/8238* | (2006.01) |

(52) U.S. Cl.
CPC ...... *H01L 21/8249* (2013.01); *H01L 27/0623* (2013.01); *H01L 27/0635* (2013.01); *H01L 29/0804* (2013.01); *H01L 29/0821* (2013.01); *H01L 29/1004* (2013.01); *H01L 29/66106* (2013.01); *H01L 29/66234* (2013.01); *H01L 21/823807* (2013.01); *H01L 21/823814* (2013.01)

(58) Field of Classification Search
CPC ............ H01L 27/0255; H01L 27/0647; H01L 29/1004; H01L 29/1008
USPC ................................ 438/189, 202, 203, 234
See application file for complete search history.

(56) References Cited

U.S. PATENT DOCUMENTS 5,001,073 A * 3/1991 Huie ............... H01L 21/761 148/DIG. 9
5,691,226 A * 11/1997 Foerstner ........... H01L 21/8249 148/DIG. 9

* cited by examiner

*Primary Examiner* — Tan N Tran
(74) *Attorney, Agent, or Firm* — Tuenlap D. Chan; Charles A. Brill; Frank D. Cimino (57) ABSTRACT

The betas of the bipolar transistors in a BiCMOS semiconductor structure are increased by forming the emitters of the bipolar transistors with two implants: a source-drain implant that forms a first emitter region at the same time that the source and drain regions are formed, and an additional implant that forms a second emitter region at the same time that another region is formed. The additional implant has an implant energy that is greater than the implant energy of the source-drain implant.

16 Claims, 6 Drawing Sheets

METHOD OF FORMING A BICMOS SEMICONDUCTOR CHIP THAT INCREASES THE BETAS OF THE BIPOLAR TRANSISTORS

BACKGROUND OF THE INVENTION

1. Field of the Invention

The present invention relates to a method of forming a BiCMOS semiconductor chip and, more particularly, to a method of forming a BiCMOS semiconductor chip that increases the betas of the bipolar transistors.

2. Description of the Related Art

A BiCMOS semiconductor chip is a chip that includes bipolar transistors and CMOS circuitry. There are two types of bipolar transistors: p-type (PNP) and n-type (NPN). Similarly, a CMOS circuit includes two types of MOS transistors: p-type (PMOS) and n-type (NMOS). Bipolar transistors have three semiconductor regions: a collector, a base, and an emitter. MOS transistors have four semiconductor regions: a source, a drain, a gate, and a body.

Most of the semiconductor regions are fabricated by forming a patterned photoresist layer over a layer of semiconductor material, and then implanting dopants into the semiconductor material through openings in the patterned photoresist layer. For example, the p+ source and drain regions of a PMOS transistor can be formed by implanting p-type dopants into an n-type body region within the semiconductor material through the openings in a patterned photoresist layer.

One of the most expensive steps in the fabrication of a semiconductor chip is the formation of the patterned photoresist layers. In an effort to reduce costs, the same patterned photoresist layer is commonly used to simultaneously form one or more bipolar semiconductor regions and one or more MOS semiconductor regions. For example, the same patterned photoresist layer can be used to simultaneously form the p+ emitter region of a bipolar transistor, and the p+ source and drain regions of a PMOS transistor.

Although this approach reduces fabrication costs, one drawback of this approach is that the ideal dopant concentration and implant energy used to form a bipolar semiconductor region are typically not the same as the ideal dopant concentration and implant energy used to form a MOS semiconductor region.

For example, the ideal dopant concentration and implant energy used to form a p+ emitter region is typically not the same as the ideal dopant concentration and implant energy used to form the p+ source and drain regions. Emitters that are formed using the dopant concentration and implant energy of the source and drain regions commonly have very low betas. Thus, there is a need for a method of forming a BiCMOS semiconductor chip that increases the betas of the bipolar transistors.

SUMMARY OF THE INVENTION

The present invention provides a method of forming a BiCMOS semiconductor chip that increases the betas of the bipolar transistors. The method includes simultaneously forming a shallow base n-well of an pnp bipolar transistor structure, a shallow emitter n-well of an npn bipolar transistor structure, and a shallow body n-well of a PMOS transistor structure in a semiconductor material. The method also includes simultaneously forming an n+ source region and an n+ drain region of an NMOS transistor structure, and an n+ emitter region of the npn bipolar transistor structure in the semiconductor material. The n+ emitter region touches the shallow emitter n-well.

The present invention further provides an alternate method of forming a BiCMOS semiconductor chip. The method includes implanting a semiconductor material with a p-type dopant to simultaneously form a first p+ emitter region of a pnp transistor structure, and a p+ source region and a p+ drain region of a PMOS transistor structure. The method also includes implanting the semiconductor material with a p-type dopant to simultaneously form a second p+ emitter region of the pnp transistor structure, and a p+ anode region of a zener diode structure. The second p+ emitter region touches the first p+ emitter region.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1A:
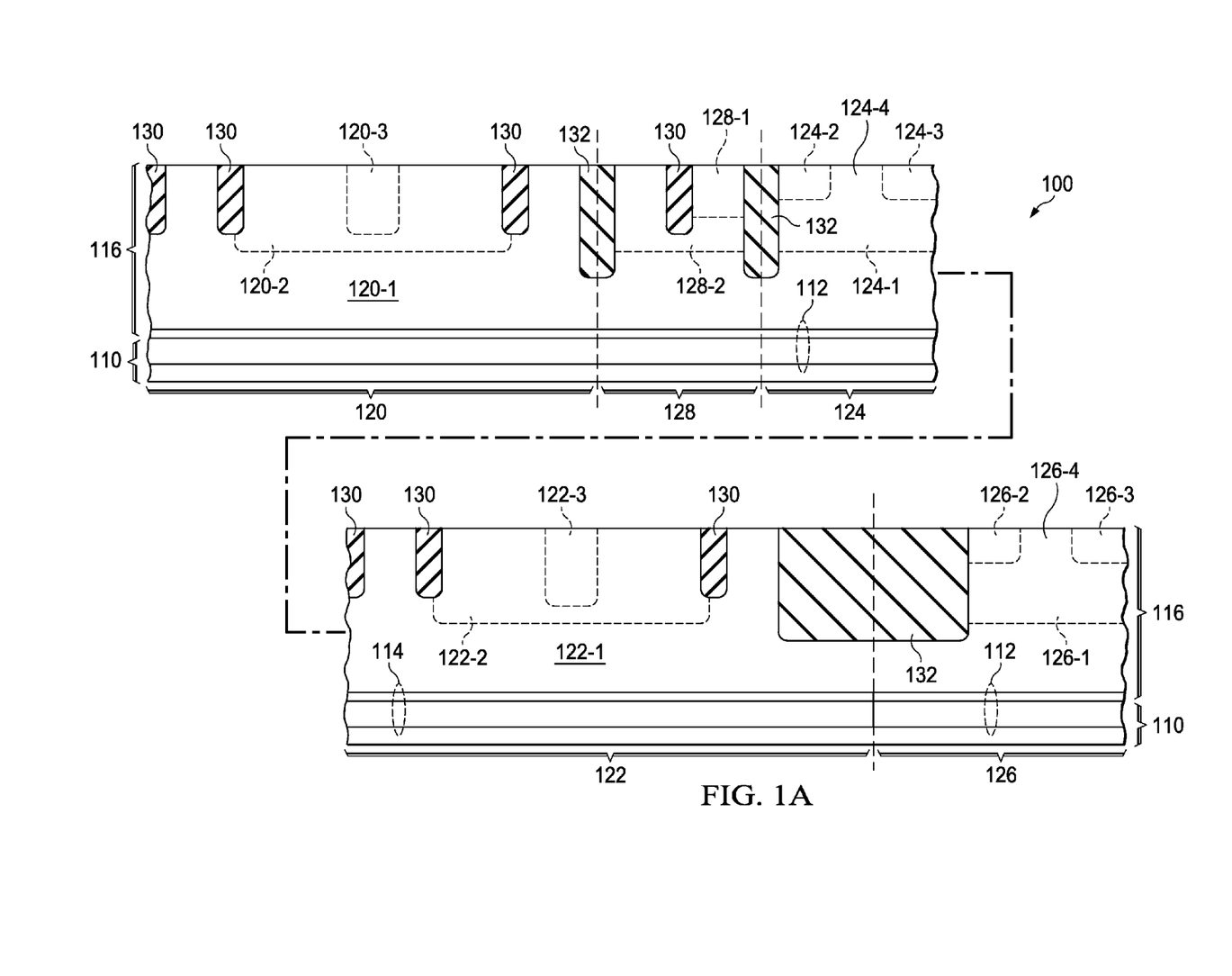
FIGS. 1A-1F are cross-sectional views illustrating an example of a method 100 of forming a BiCMOS semiconductor chip in accordance with the present invention.

FIGS. 1A-1F show cross-sectional views that illustrate an example of a method 100 of forming a BiCMOS semiconductor chip in accordance with the present invention. As shown in FIG. 1A, method 100, which utilizes a conventionally-formed semiconductor substrate 110, begins by forming a p+ buried layer 112 and an n+ buried layer 114 in substrate 110.

P+ buried layer 112 can be formed by first forming a p-buried patterned photoresist layer on semiconductor substrate 110. The p-buried patterned photoresist layer is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

After the p-buried patterned photoresist layer has been formed, a p-type dopant is implanted into semiconductor substrate 110 through the p-buried patterned photoresist layer to form p+ buried layer 112. Once p+ buried layer 112 has been formed, the p-buried patterned photoresist layer is removed in a conventional fashion, such as with an ash process.

The process is then repeated by forming an n-buried patterned photoresist layer on semiconductor substrate 110, and then implanting an n-type dopant into semiconductor substrate 110 through the n-buried patterned photoresist layer to form n+ buried layer 114. After n+ buried layer 114 has been formed, the n-buried patterned photoresist layer is removed in a conventional manner. (The order in which the p+ and n+ buried layers 112 and 114 are formed can be reversed.)

Following this, a p-type epitaxial layer 116 is grown on the top surface of semiconductor substrate 110 in a conventional manner using well-known steps. The growth of p-type epitaxial layer 116 causes the p+ and n+ buried layers 112 and 114 to diffuse up a short distance into epitaxial layer 116.

Epitaxial layer 116 has a number of regions, including a PNP region 120, an NPN region 122, a PMOS region 124, an NMOS region 126, and a diode region 128. PNP region 120 has a collector region 120-1, a base region 120-2 that touches collector region 120-1, and an emitter region 120-3 that touches base region 120-2. NPN region 122 has a collector region 122-1, a base region 122-2 that touches collector region 122-1, and an emitter region 122-3 that touches base region 122-2.

PMOS region 124 has a body region 124-1, a source region 124-2 that touches body region 124-1, and a drain region 124-3 that touches body region 124-1 and lies spaced apart from source region 124-2. PMOS region 124 also has a channel region 124-4 of the body region 124-1 that lies between the source and drain regions 124-2 and 124-3.

NMOS region 126 has a body region 126-1, a source region 126-2 that touches body region 126-1, and a drain region 126-3 that touches body region 126-1 and lies spaced apart from source region 126-2. NMOS region 126 also has a channel region 126-4 of the body region 126-1 that lies between the source and drain regions 126-2 and 126-3. Diode region 128 has an anode region 128-1 and a cathode region 128-2 that touches anode region 128-1.

After epitaxial layer 116 has been formed, a number of shallow trench isolation structures 130 and deep trench isolation structures 132 are formed in epitaxial layer 116 using well-known conventional steps. FIG. 1A shows a cross-sectional view that illustrates a BiCMOS semiconductor structure that results following the formation of the trench isolation structures 130 and 132.

Figure 1B:
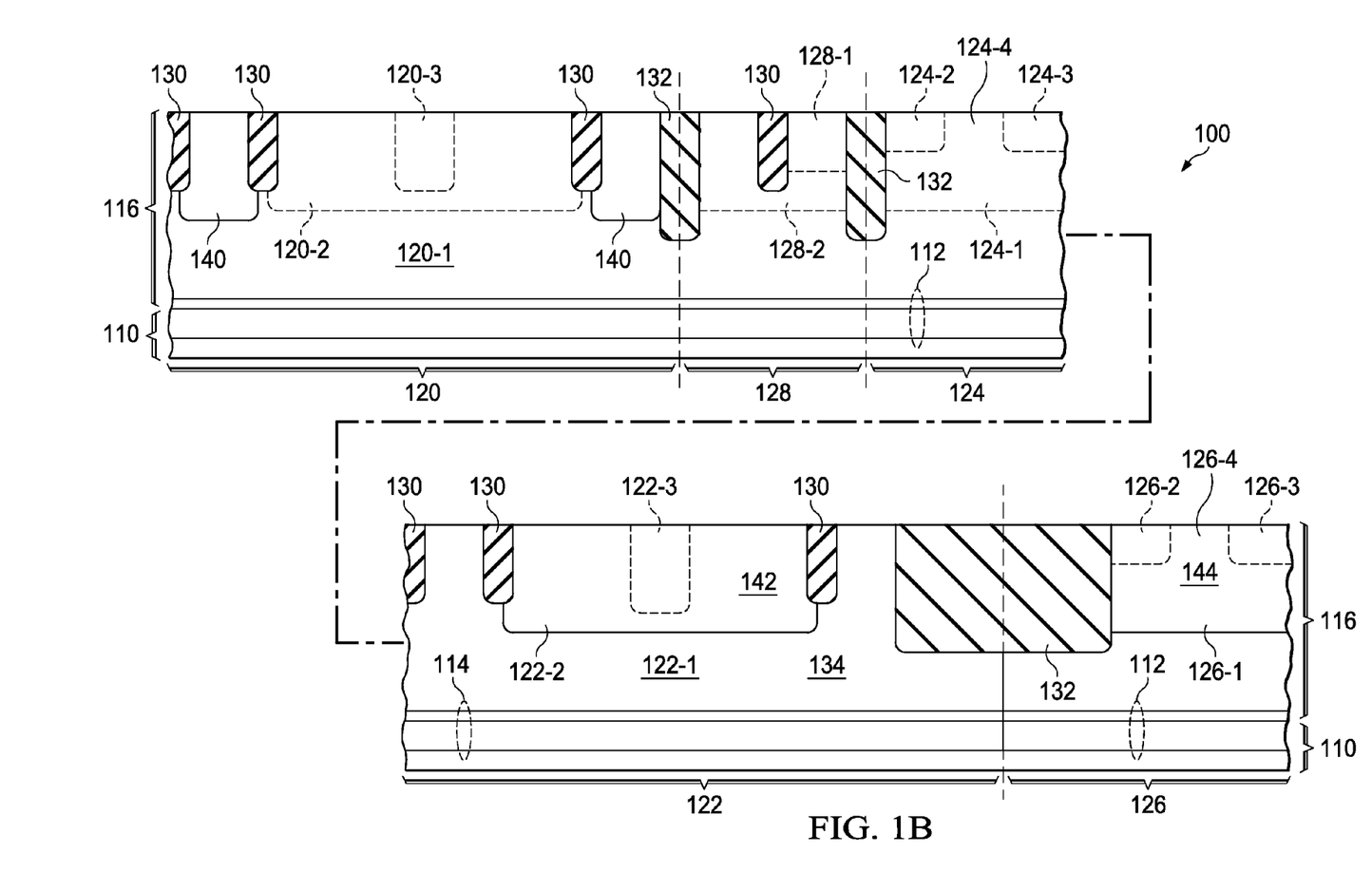

As shown in FIG. 1B, once the trench isolation structures 130 and 132 have been formed, method 100 next forms a deep n-well 134 in the NPN region 122 of epitaxial layer 116 that extends down to touch n+ buried layer 114. The formation of deep n-well 134 converts collector region 122-1, base region 122-2, and emitter region 122-3 from p-type regions to n-type regions.

Deep n-well 134 can be formed by first forming a deep-well patterned photoresist layer on epitaxial layer 116 in a conventional fashion. After the deep-well patterned photoresist layer has been formed, an n-type dopant is implanted into the NPN region 122 of epitaxial layer 116 through the deep-well patterned photoresist layer to form deep n-well 134. Following this, the deep-well patterned photoresist layer is conventionally removed.

Once the deep well patterned photoresist layer has been removed, a p-well patterned photoresist layer is conventionally formed on epitaxial layer 116. Next, a p-type dopant is implanted into epitaxial layer 116 through the p-well patterned photoresist layer to form a number of shallow p-wells.

The shallow p-wells include a pair of shallow collector p-wells 140 that are formed in the collector region 120-1 of PNP region 120. The shallow collector p-wells 140 function as part of the collector of a PNP transistor. The shallow p-wells also include a shallow base p-well 142 that is formed in the base region 122-2 and the emitter region 122-3 of NPN region 122. The portion of shallow base p-well 142 that lies in base region 122-2 functions as the base of an NPN transistor.

The shallow p-wells additionally include a shallow body p-well 144 that is formed in body region 126-1, source region 126-2, drain region 126-3, and channel region 126-4 of NMOS region 126. The portion of shallow body p-well 144 that lies in body region 126-1 and channel region 126-4 functions as the body of an NMOS transistor. The shallow p-wells 140, 142, and 144 can be formed using the dopant concentration and implant energy of shallow p-well 144, which is part of the NMOS transistor. After this, the p-well patterned photoresist layer is removed in a conventional fashion.

Figure 1C:
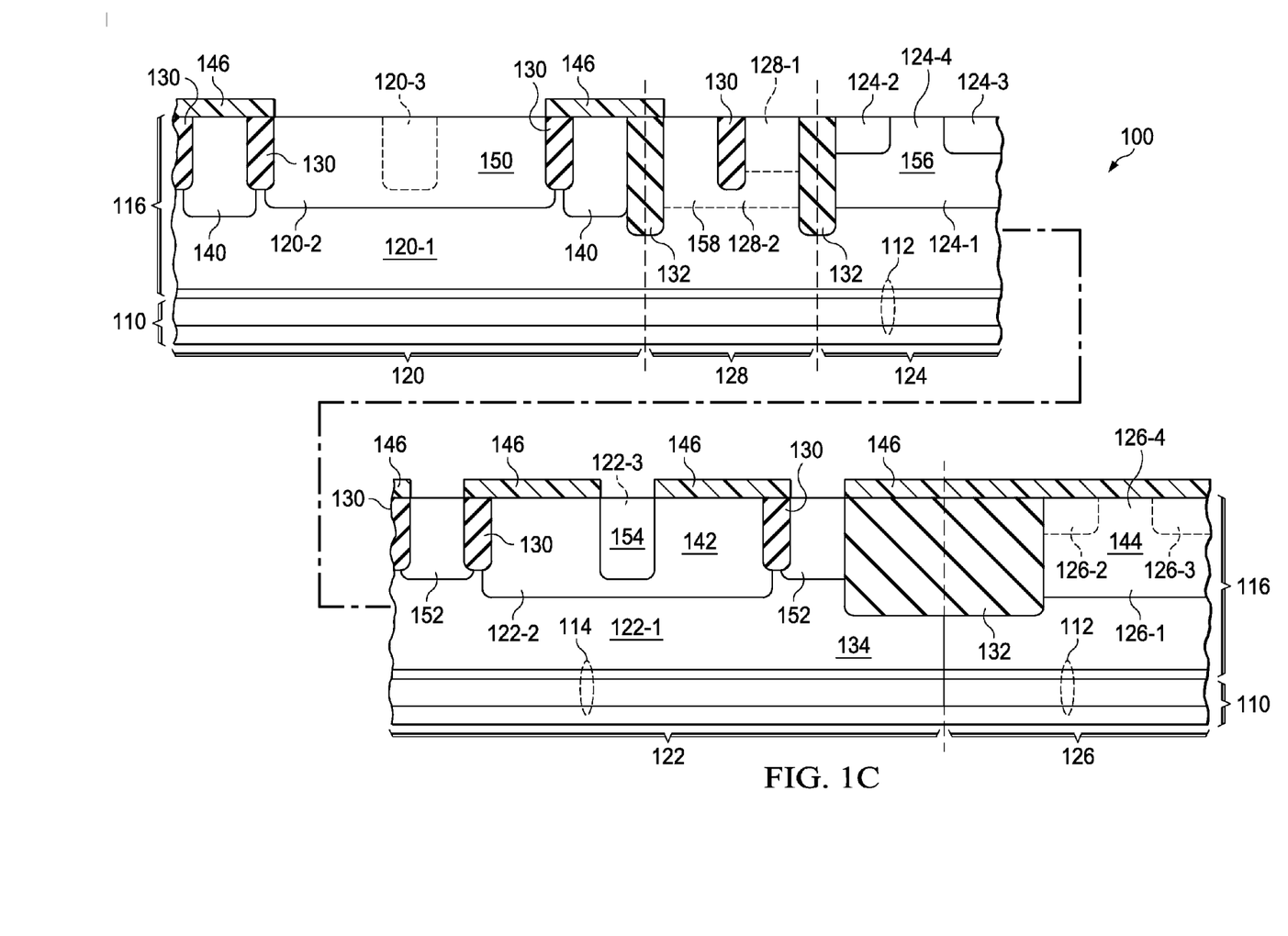

FIG. 1B shows a cross-sectional view that illustrates a BiCMOS semiconductor structure that results following the formation of the shallow p-wells 140, 142, and 144. As shown in FIG. 1C, after the p-well patterned photoresist layer has been removed, a patterned photoresist layer 146 is conventionally formed on epitaxial layer 116.

After patterned photoresist layer 146 has been formed, an n-type dopant is implanted into epitaxial layer 116 through patterned photoresist layer 146 to form a number of shallow n-wells. The shallow n-wells include a shallow base n-well 150 that is formed in the base region 120-2 and the emitter region 120-3 of PNP region 120. The portion of shallow base n-well 150 that lies in base region 120-2 functions as the base of the PNP transistor. Shallow base n-well 150 converts the base region 120-2 and the emitter region 120-3 of PNP region 120 from p-type regions to n-type regions.

The shallow n-wells also include a pair of shallow collector n-wells 152 that are formed in the collector region 122-1 of NPN region 122. The shallow collector n-wells 152 function as part of the collector of the NPN transistor. The shallow n-wells additionally include a shallow emitter n-well 154 that is formed in emitter region 122-3 of NPN region 122. Shallow emitter n-well 154 converts emitter region 122-3 from a p-type region to an n-type region, and functions as part of the emitter of the NPN transistor.

The shallow n-wells further include a shallow body n-well 156 that is formed in body region 124-1, source region 124-2, drain region 124-3 and channel region 124-4 of PMOS region 124. The portion of shallow body n-well 156 that lies in body region 124-1 and channel region 124-4 functions as the body of a PMOS transistor. Shallow n-well 156 converts body region 124-1, source region 124-2, drain region 124-3, and channel region 124-4 from p-type regions to n-type regions.

In addition, the shallow n-wells include a shallow cathode n-well 158 that is formed in anode region 128-1 and cathode region 128-2 of diode region 128. Shallow cathode n-well 158 functions as part of the cathode of a zener diode. Shallow cathode n-well 158 converts anode region 128-1 and cathode region 128-2 from p-type regions to n-type regions. The shallow n-wells 150, 152, 154, 156, and 158 can be formed using the dopant concentration and implant energy of shallow n-well 156, which is a part of the PMOS transistor.

The shallow n-wells 150, 152, 154, 156, and 158 are formed with a lower implant energy than the shallow p-wells 140, 142, and 144 and, as a result, do not extend down as deeply into epitaxial layer 116 as the shallow p-wells 140, 142, and 144. After this, patterned photoresist layer 146 is removed in a conventional manner.

Figure 1D:
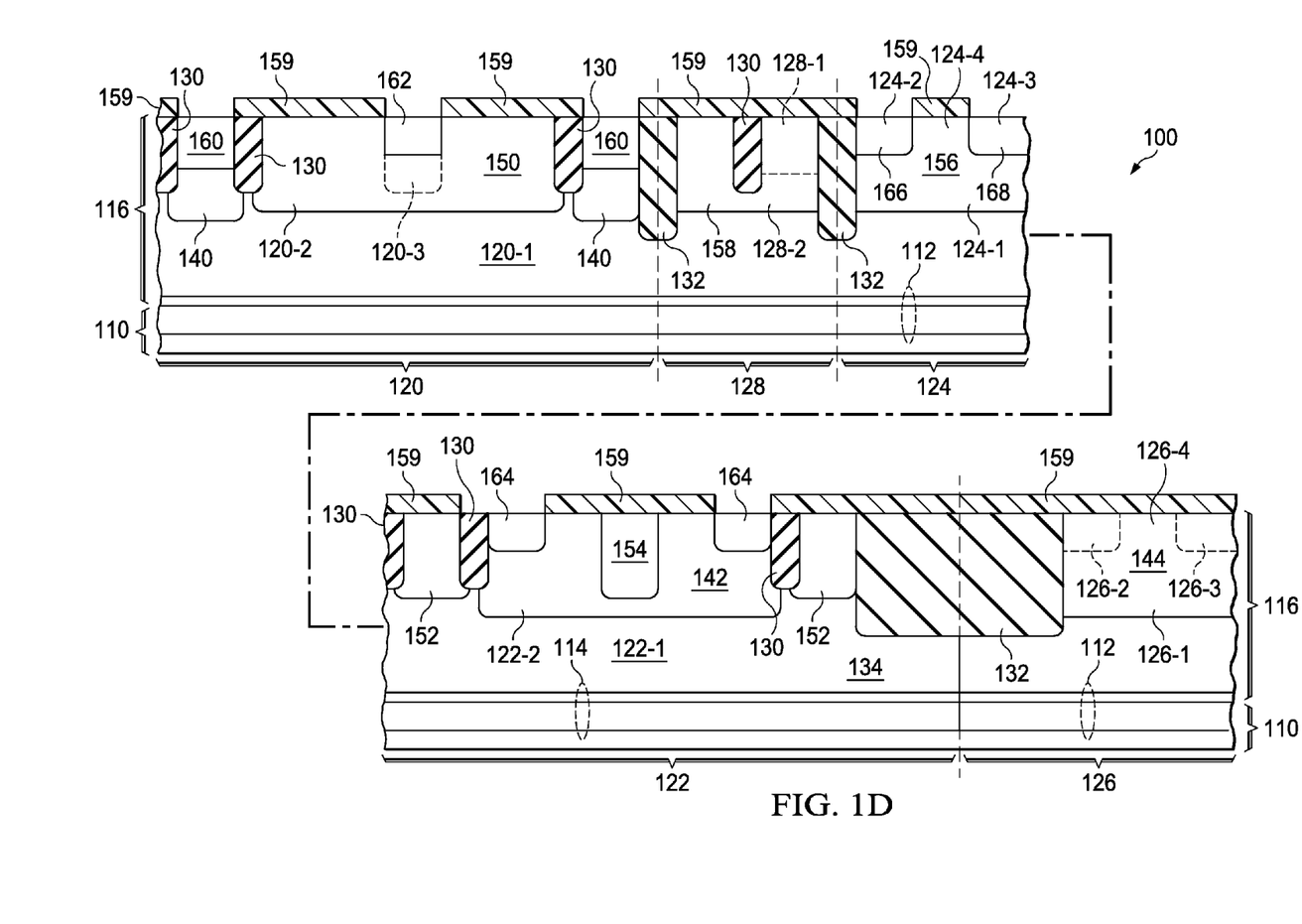

As shown in FIG. 1D, after patterned photoresist layer 146 has been removed, a patterned photoresist layer 159 is conventionally formed on epitaxial layer 116. Once patterned photoresist layer 159 has been formed, a p-type dopant is implanted into epitaxial layer 116 through patterned photoresist layer 159 to form a number of p+ regions.

The p+ regions include a pair of p+ contact regions 160 that are formed in the pair of shallow p-wells 140. The pair of p+ contact regions 160 function as the collector contact regions of the PNP transistor. The p+ regions also include a first p+ emitter region 162 that is formed in a portion of emitter region 120-3. First p+ emitter region 162 functions as part of the emitter of the PNP transistor.

The p+ regions further include a pair of p+ contact regions 164 that are formed in the shallow p-well 142. The pair of p+ contact regions 164 function as the base contact regions of the NPN transistor. The p+ regions additionally include a p+ source region 166 and a p+ drain region 168 that are formed spaced apart in shallow body n-well 156. The p+ regions 160, 162, 164, 166, and 168 can be formed using the dopant concentration and implant energy of the p+ source and drain regions 166 and 168, which are part of the PMOS transistor. After this, patterned photoresist layer 159 is removed in a conventional fashion.

Figure 1E:
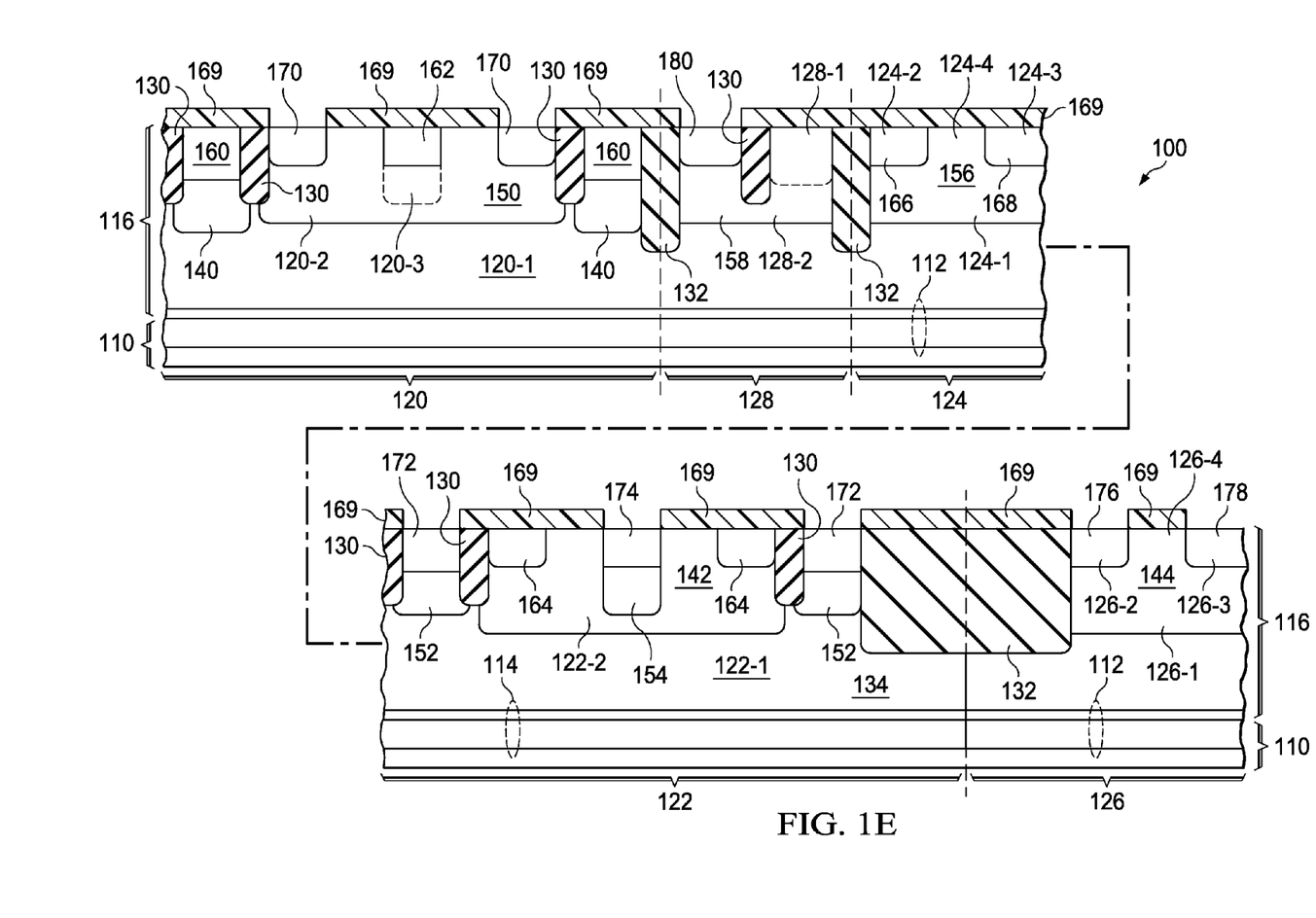

As shown in FIG. 1E, after patterned photoresist layer 159 has been removed, a patterned photoresist layer 169 is conventionally formed on epitaxial layer 116. Once patterned photoresist layer 169 has been formed, an n-type dopant is implanted into epitaxial layer 116 through patterned photoresist layer 169 to form a number of n+ regions.

The n+ regions include a pair of n+ contact regions 170 that are formed in the shallow n-well 150. The pair of n+ contact regions 170 function as the base contact regions of the PNP transistor. The n+ regions also include a pair of n+ contact regions 172 that are formed in the pair of shallow n-wells 152. The pair of n+ contact regions 172 function as the collector contact regions of the NPN transistor.

The n+ regions additionally include an n+ emitter region 174 that is formed in the upper portion of shallow emitter n-well 154. N+ emitter region 174 and shallow emitter n-well 154 function as the emitter of the NPN transistor. The n+ regions further include an n+ source region 176 and an n+ drain region 178 that are formed spaced apart in shallow p-well 144.

The n+ regions also include an n+ cathode region 180 that is formed in the upper portion of shallow cathode n-well 158. N+ cathode region 180, along with shallow cathode n-well 158, function as the cathode of the zener diode. The n+ regions 170, 172, 174, 176, 178, and 180 can be formed using the dopant concentration and implant energy of the n+ source and drain regions 176 and 178, which are part of the NMOS transistor. After this, patterned photoresist layer 169 is removed in a conventional manner.

Figure 1F:
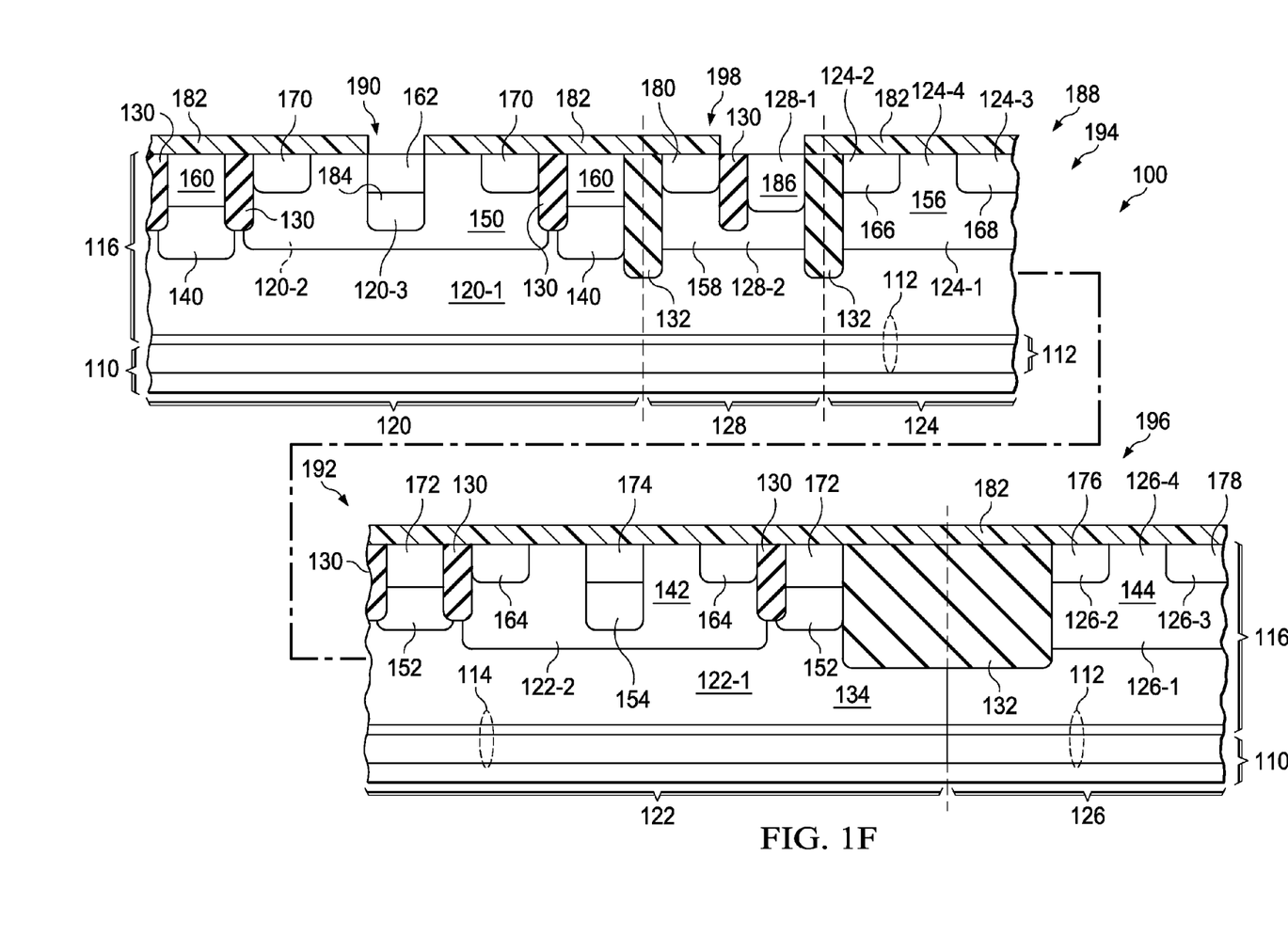

As shown in FIG. 1F, after patterned photoresist layer 169 has been removed, a patterned photoresist layer 182 is conventionally formed on epitaxial layer 116. Once patterned photoresist layer 182 has been formed, a p-type dopant is implanted into epitaxial layer 116 through patterned photoresist layer 182 to form a number of deeper p+ regions.

The deeper p+ regions include a second p+ emitter region 184 that is formed in the emitter region 120-3 of PNP region 120. First p+ emitter region 162 and second p+ emitter region 184 function as the emitter of the PNP transistor. The deeper p+ regions also include a p+ anode region 186 that is formed in the anode region 128-1 of diode region 128. P+ anode region 186 functions as the anode of the zener diode. The deeper p+ regions 184 and 186 can be formed using the dopant concentration and implant energy of p+ anode region 186, which is a part of the zener diode.

After this, patterned photoresist layer 182 is removed in a conventional manner to form a BiCMOS semiconductor structure 188. Method 100 then continues with conventional steps, including the formation of a gate oxide layer, and gates that lie on the gate oxide layer over the channel regions 124-4 and 126-4 of the PMOS and NMOS regions 124 and 126, respectively.

BiCMOS semiconductor structure 188 includes a PNP bipolar transistor 190, which has a collector (120-1, 140, and 160), a base (150 and 170), and an emitter (162 and 184). BiCMOS semiconductor structure 188 also includes an NPN bipolar transistor 192, which has a collector (134, 152, and 172), a base (142 and 164), and an emitter (154 and 174).

In addition, BiCMOS semiconductor structure 188 includes a PMOS transistor structure 194, which has a body (156), a source (166), a drain (168), and a channel region (124-4) that lies between the source and drain (166 and 168). Further, BiCMOS semiconductor structure 188 includes an NMOS transistor structure 196, which has a body (144), a source (176), a drain (178), and a channel region (126-4) that lies between the source and drain (166 and 168). BiCMOS semiconductor structure 188 also includes a zener diode 198, which has an anode (186) and a cathode (158 and 180).

One of the advantages of method 100 is that method 100 forms the emitters of the bipolar transistors with two implants: a source-drain implant and an additional implant which has an implant energy that is greater than the implant energy of the source-drain implant. For example, the emitter of PNP transistor 190 is formed with a source-drain implant that forms p+ emitter region 162 at the same time that the p+ source and drain regions 166 and 168 are formed. The emitter of PNP transistor 190 is also formed with an anode implant that forms p+ emitter region 184 at the same time that the p+ anode 186 is formed.

The implant energy used with the anode implant to form p+ emitter region 184 and p+ anode region 186 is greater than the implant energy that is used with the source-drain implant to form the p+ source and drain 166 and 168. As a result, the anode implant increases the depth of the PNP emitter.

A PNP bipolar transistor without p+ emitter region 184 has a very low beta (approximately 10) because the dopant concentration of the shallow n-well 150 used to form the base is relatively large. Increasing the depth of the emitter with p+ emitter region 184 partially compensates for the relatively-large dopant concentration of the shallow n-well 150 which, in turn, increases the beta of the PNP bipolar transistor.

As a second example, the emitter of NPN transistor 192 is formed with a source-drain implant that forms n+ emitter region 174 at the same time that the n+ source and drain regions 176 and 178 are formed. The emitter of NPN transistor 192 is also formed with a shallow n-well implant that forms emitter n-well 154 at the same time that the shallow n-wells 150, 152, 156, and 158 are formed.

The implant energy used with the shallow n-well implant to form the shallow n-wells 150, 152, 154, 156, and 158 is greater than the implant energy that is used with the source-drain implant to form the n+ source and drain 176 and 178. As a result, the shallow n-well implant increases the depth of the NPN emitter.

An NPN bipolar transistor without shallow emitter n-well 154 has a very low beta because the dopant concentration of the shallow p-well 142 that is used to form the base is relatively large. Increasing the depth of the emitter with shallow emitter n-well 154 also partially compensates for the relatively-large dopant concentration of the shallow p-well 142 which, in turn, increases the beta of the NPN bipolar transistor.

It should be understood that the above descriptions are examples of the present invention, and that various alternatives of the invention described herein may be employed in practicing the invention. For example, the n+ regions 170, 172, 174, 176, 178, and 180 can be formed before the p+ regions 160, 162, 164, and 168 are formed. Similarly, the p+ regions 184 and 186 can be formed before the p+ regions 160, 162, 164, and 168 are formed. Thus, it is intended that the following claims define the scope of the invention and that structures and methods within the scope of these claims and their equivalents be covered thereby.

What is claimed is:

1. A method of forming a BiCMOS semiconductor structure, the method comprising:
    simultaneously forming a shallow base n-well of an pnp bipolar transistor structure, a shallow emitter n-well of an npn bipolar transistor structure, and a shallow body n-well of a PMOS transistor structure in a semiconductor material; and
    simultaneously forming an n+ source region and an n+ drain region of an NMOS transistor structure, and an n+ emitter region of the npn bipolar transistor structure in the semiconductor material, the n+ emitter region touching the shallow emitter n-well.

2. The method of claim 1 and further comprising simultaneously forming a p+ source region and a p+ drain region of the PMOS transistor structure, and a first p+ emitter region of the pnp bipolar transistor structure in the semiconductor material, the p+ source region and the p+ drain region touching the shallow body n-well, the first p+ emitter region touching the shallow base n-well.

3. The method of claim 2 and further comprising simultaneously forming a second p+ emitter region of the pnp bipolar transistor structure, and a p+ anode region of a zener diode structure, the second p+ emitter region touching the first p+ emitter region.

4. The method of claim 3 wherein the second p+ emitter region lies below the first p+ emitter region.

5. The method of claim 3 wherein the shallow emitter n-well lies below the n+ emitter region.

6. The method of claim 3 wherein a shallow cathode n-well of the zener diode structure is formed at a same time that the shallow base n-well is formed.

7. The method of claim 6 wherein an n+ cathode region of the zener diode structure is formed at a same time that the n+ source region and the n+ drain region are formed, the n+ cathode region touching the shallow cathode n-well, the shallow cathode n-well touching the p+ anode region.

8. The method of claim 7 and further comprising simultaneously forming a shallow base p-well of the npn bipolar transistor structure, and a shallow body p-well of the NMOS transistor structure in the semiconductor material, the shallow base p-well touching the n+ emitter region and the shallow emitter n-well.

9. The method of claim 8 wherein the shallow body p-well touches the n+ source region and the n+ drain region.

10. A method of forming a BiCMOS semiconductor structure, the method comprising:
    simultaneously forming a shallow base n-well of an pnp bipolar transistor structure, a shallow emitter n-well of an npn bipolar transistor structure, and a shallow body n-well of a PMOS transistor structure in a semiconductor material;
    simultaneously forming an n+ source region and an n+ drain region of an NMOS transistor structure, and an n+ emitter region of the npn bipolar transistor structure in the semiconductor material, the n+ emitter region touching the shallow emitter n-well;
    simultaneously forming a p+ source region and a p+ drain region of the PMOS transistor structure, and a first p+ emitter region of the pnp bipolar transistor structure in the semiconductor material, the p+ source region and the p+ drain region touching the shallow body n-well, the first p+ emitter region touching the shallow base n-well; and
    simultaneously forming a second p+ emitter region of the pnp bipolar transistor structure, and a p+ anode region of a zener diode structure, the second p+ emitter region touching the first p+ emitter region.

11. The method of claim 10 wherein the second p+ emitter region lies below the first p+ emitter region.

12. The method of claim 10 wherein the shallow emitter n-well lies below the n+ emitter region.

13. The method of claim 10 wherein a shallow cathode n-well of the zener diode structure is formed at a same time that the shallow base n-well is formed.

14. The method of claim 13 wherein an n+ cathode region of the zener diode structure is formed at a same time that the n+ source region and the n+ drain region are formed, the n+ cathode region touching the shallow cathode n-well, the shallow cathode n-well touching the p+ anode region.

15. The method of claim 14 and further comprising simultaneously forming a shallow base p-well of the npn bipolar transistor structure, and a shallow body p-well of the NMOS transistor structure in the semiconductor material, the shallow base p-well touching the n+ emitter region and the shallow emitter n-well.

16. The method of claim 15 wherein the shallow body p-well touches the n+ source region and the n+ drain region.

* * * * *